United States Patent [19]
Lee et al.

[11] Patent Number: 6,166,898
[45] Date of Patent: Dec. 26, 2000

[54] PLASMA CHAMBER WAFER CLAMPING RING WITH EROSION RESISTIVE TIPS

[75] Inventors: Ray C. Lee, Taipei; Mu-Tsun Ting, Yun-Lin; Jen-Hui Hsiao, Chun-Ho; Troy Chen, Yung-Kang, all of Taiwan

[73] Assignees: ProMOS Technologies, Inc.; Mosel Vitelic, Inc., both of Hsinchu, Taiwan; Slemens AG, Munich, Germany

[21] Appl. No.: 09/183,014

[22] Filed: Oct. 30, 1998

[51] Int. Cl.$^7$ ...................................................... H01L 21/00
[52] U.S. Cl. ........................................ 361/234; 156/380.6
[58] Field of Search ................................... 361/233, 234; 29/25.01, DIG. 16; 156/89.12, 272.2, 272.4, 272.6, 273.1, 273.7, 358, 379.6, 380.6, 381, 382

[56] References Cited

U.S. PATENT DOCUMENTS 5,292,399  3/1994  Lee et al. ................................. 156/643
5,810,931  9/1998  Stevens et al. .......................... 118/721

*Primary Examiner*—Ronald W. Leja
*Attorney, Agent, or Firm*—Proskauser Rose LLP

[57] ABSTRACT

A plasma erosion resistive clamping ring is provided for clamping a wafer in a plasma treatment chamber. The plasma erosion resistive clamping ring comprises a ring and one or more tips secured to, and mutually spaced apart about, a circumference of the ring. Each of the tips projects away from the ring, in a radial direction, towards an interior of the ring. Each tip has plural side surfaces that taper to, and meet, a single, continuous surface of rotation. The surface of rotation is located in the interior of the ring at a location of the tip which is radially most distant from the ring. The meeting of the tapered sides at the single continuous surface of rotation has a cross-section, taken in a plane of the ring, as follows. The cross-section comprises first and second line segments, on lines that intersect at an acute angle, and an arc of a convex ellipse, that begins at an end of the first line segment most distant from the ring, and ends at an end of the second line segment most distant from the ring.

18 Claims, 2 Drawing Sheets

US 6,166,898

PLASMA CHAMBER WAFER CLAMPING RING WITH EROSION RESISTIVE TIPS

RELATED APPLICATIONS

The following patent application contains subject matter which is related to the subject matter of this application:

U.S. patent application Ser. No. 09/183,015 entitled "Plasma Chamber With Erosion Resistive Securement Screws," filed for Ray C. Lee, Te-Hsun Pang, Tonny Shu and Birdson Lee on even date herewith.

The above-listed patent application is commonly owned by the assignees of this application and the contents of the above-listed patent application are incorporated herein by reference.

FIELD OF THE INVENTION

The present application pertains to plasma treatment chambers such as those used in semiconductor integrated circuit fabrication.

BACKGROUND OF THE INVENTION

FIG. 1 shows a plasma chamber which may, for example, be used in the fabrication of semiconductor integrated circuits. As shown, a wafer W (e.g., on which one or more semiconductor integrated circuits are formed) is positioned between first and second electrodes e1 and e2 located at opposite sides of the chamber. The wafer W is also located between north m1 and south m2 poles of a magnet also on opposite sides of the chamber, which sides are orthogonal to the sides at which the electrodes e1 and e2 are located. A low pressure gas G is introduced into the plasma chamber through an inlet port, such as a shower head S. A voltage source V applies an oscillating voltage (of, for example, 13.58 MHz) across the electrodes e1 and e2 to produce an electric field E directed between the two electrodes e1 and e2. This tends to cause the molecules of the low pressure gas G to gyrate in a cycloid motion. The north and south poles m1 and m2 of the magnet introduce a magnetic field B directed between the two poles, which magnetic field B is orthogonal to the electric field E. This tends to increase the collisions of the gyrating molecules thereby completely ionizing them to form the plasma P over the wafer W. A coolant C, such as liquid He, may be circulated on the underside of the wafer W to cool it during treatment.

FIG. 2 shows a more detailed view of certain parts of an actual plasma chamber 100, such as the MXP Centura™, distributed by Applied Materials, Inc.™, located in Santa Clara, Calif. The chamber 100 has cylindrically shaped sidewalls 105. A cathode 110 is located at the bottom of the chamber 100. A pedestal 120 is secured to the cathode 110. (Actually, additional parts may be secured to the cathode 110 between the cathode 110 and the pedestal 120, such as an O-ring and aluminum sheet interface. These are omitted for sake of brevity.) The pedestal 120 is secured by screwing screws through the holes 122 of the pedestal 120 and the holes 112 of the cathode 110. A quartz pedestal liner ring, not shown, may then be placed in the chamber 100 surrounding the pedestal 120 (for purposes of improving the uniformity of the flow of the plasma gas over the entire wafer W). A transparent quartz cover or focus ring 150 may then be secured to the top of the chamber 100 to form a gas-tight seal, thereby confining the plasma P within the chamber 100 and isolating the wafer W from external contamination. As shown, the quartz cover or focus ring 150 is secured by screwing screws 130 through holes 132 to the chamber 100 or another part secured therein (not shown for sake of brevity). A quartz cap 140 may be placed on top of each screw 130.

The wafer W may be secured to the pedestal 120 in one of two ways. The pedestal 120 can be an electrostatic chucking pedestal. Such a pedestal 120 can generate an electrostatic charge that holds the wafer W in place during treatment. Alternatively, an ordinary pedestal 120 may be used. In such a case, the wafer W is then clamped to the pedestal 120 using a clamping ring 160. As shown, the clamping ring 160 has plural tips 170 which extend radially towards the interior of the ring 160. The dimensions of the clamping ring 160 are such that the ring 165 thereof has a greater diameter than the wafer W and does not touch the wafer. Rather, only the tips 170 contact and touch the wafer W. The tips 170 have holes 172 to enable screwing the clamping ring 160 to the pedestal 120 using (e.g., metal) screws 131 (which in turn are covered by graphite plugs, not shown) so that the tips 170 contact and press down on the wafer W, thereby holding it in place.

Plasma treatment is commonly used to etch structures on the wafer, such as polycrystalline silicon (poly) and oxide structures. Specifically, wafer structures not to be etched are typically covered with a mask whereas wafer structures to be etched are left exposed. The treatment using the plasma erodes the exposed structures.

Such a plasma erosive effect is also incurred by the various parts within the chamber 100. This reduces the life time of the parts. Moreover, because such parts are eroded while treating the wafer, the eroded material of the parts is introduced in the plasma chamber 100 as a contaminant. This tends to reduce the yield of the semiconductor integrated circuits formed from the treated wafers. Two parts specifically subject to the plasma erosive effect are the screws 130, used to secure the quartz focus ring or cover 150 (and, theoretically can be used to secure other objects within the plasma chamber 100), and the clamping rings 160.

FIGS. 3 and 4 show tips 171 and 173 of two conventional types of clamping rings 160. These rings 171 and 173 are preferably made of a polyimide material, such as the material marketed under the brand name Vespel™ by DuPont Engineering Polymers,™ located in Newark, Del. The tip 171 has two tapering planar sides s1 and s2 that meet at a planar surface s3 which is radially most distant from the ring 165. The surfaces s1 and s2 meet the surface s3 at sharp edges having negligible surface areas. The surface s3, itself, has a width 11 of only 1 mm. In addition, the top surface s4 also tapers so as to further reduce the height 14 of the surface s3 to about 1.5 mm. A recess having a length of about 13=3 mm in the radial direction is provided for receiving the wafer W thereunder when clamped. The tip 171 is most commonly used for poly etching applications.

The tip 173 also has tapering, planar surfaces s1' and s2'. These surface s1' meets one edge of cylindrical surface s5. The opposite edge of the cylindrical surface s5 meets an edge of the surface s3'. The opposite edge of the surface s3' meets an edge of the cylindrical surface s6, which is a mirror image of the surface s5. The opposite edge of the cylindrical surface s6 meets an edge of the surface s2'. Each cylindrical surface s5 and s6 constitutes less than $\pi/2$ of a rotation of the cylinder (due to the slight taper of the sides s1' and s2') and furthermore has a radius of less than 0.5 mm. As such, each of these surfaces s5 and s6 has a very small surface area and functions as a slightly blunted corner edge between the surface s3' and the surface s1' or s2', respectively. When viewed as such, the surface s3' separates the surfaces s1' and s2' by about 12≈3 mm. The recess length 13' is also shorter. e.g., about 2 mm. The tips 173 are used for oxide etching applications.

The problem with the prior art rings 160 is that the tips 171 and 173 wear out very quickly by the above-noted plasma erosion phenomenon. The typical useful life of a ring 160 is about 230 hours, if the ring has tips 171, and 230 hours, if the ring has tips 173. The tips 171 and 173 are typically made longer (i.e., with a longer dimension 13 or 13') to increase their lifetime. However, this increases the tip contact area on the wafer thereby reducing the amount of surface area on the wafer that can be used for integrated circuits. In addition, the etching in the vicinity of the tips 171 or 173 is not as uniform as the remainder of the wafer. Moreover, due to the rapid erosion of the tips 171 and 173 of the rings 160, a large amount of contaminant particles are introduced during the plasma etching, thereby lowering yield.

It is an object of the present invention to overcome the disadvantages of the prior art.

SUMMARY OF THE INVENTION

This and other objects are achieved by the present invention. According to one embodiment, a plasma erosion resistive clamping ring is provided for clamping a wafer in a plasma treatment chamber. The plasma erosion resistive clamping ring comprises a ring and one or more tips secured to, and mutually spaced apart about, a circumference of the ring. Each of the tips projects away from the ring, in a radial direction, towards an interior of the ring. Each tip has plural side surfaces that taper to, and meet, a single, continuous surface of rotation. The surface of rotation is located in the interior of the ring at a location of the tip which is radially most distant from the ring. The meeting of the tapered sides at the single continuous surface of rotation has a cross-section, taken in a plane of the ring, as follows. The cross-section comprises first and second line segments, on lines that intersect at an acute angle, and an arc of a convex ellipse, that begins at an end of the first line segment most distant from the ring, and ends at an end of the second line segment most distant from the ring.

A clamping ring with such a tip geometry is free of sharp, "pointed" low-surface area edges, in particular at the vicinity at which the wafer is clamped. This tends to reduce the accumulation of an electrical charge on the tips, thereby reducing plasma erosion of the tips and introduction of contaminant impurities in the chamber. Ring lifetime is dramatically increased, and plasma flow uniformity is furthermore improved in the vicinity of the tips.

DETAILED DESCRIPTION OF THE INVENTION

Figure 1:
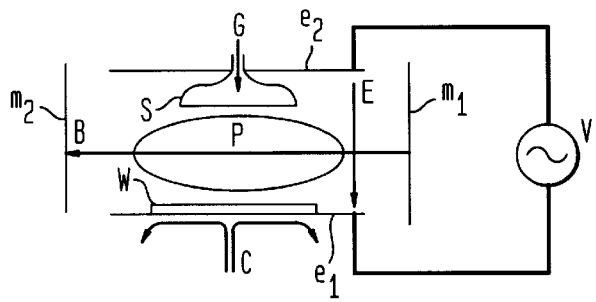
FIG. 1 shows a schematic of a conventional plasma chamber.
Figure 3:
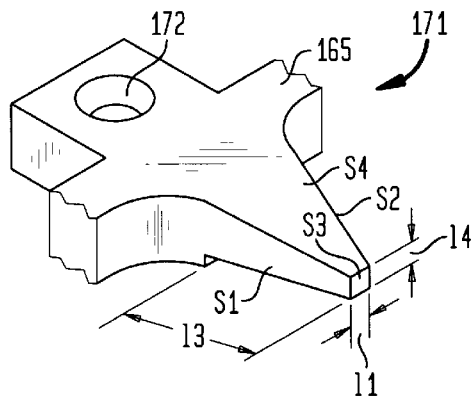
FIG. 3 shows a first prior art clamping ring tip.
Figure 4:
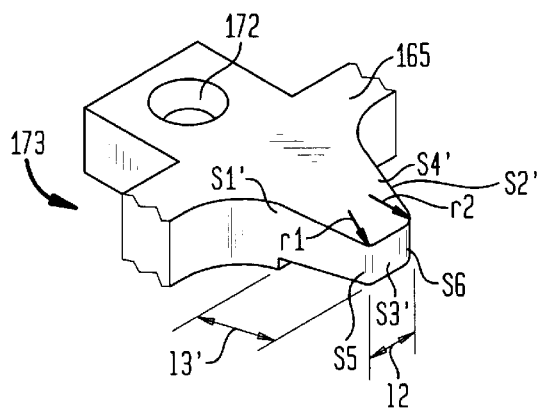
FIG. 4 shows a second prior art clamping ring tip.

It has been discovered that the rapid plasma erosion rate of the prior art clamping ring tips 171 and 173 (FIGS. 3 and 4) is a result of their geometry. Specifically, each tip 171 and 173 has sharp or pointed edges (e.g., the edges where the surface s3 meets the surfaces s1, s2 and s4, respectively, in FIG. 3, the surfaces s5 and s6 at which the surface s3' "meets" the surfaces s1' and s2' in FIG. 4 or the edge at which the surface s3' meets the surface s4' in FICr 4), with very small or negligible surface areas. As is known, the magnetic field B (FIG. 1) applied during the plasma treatment process produces a net drift of the plasma P. This tends to distribute the charged ions of the plasma such that a net negative charge accumulates near one magnetic pole and a net positive charge accumulates at the other magnetic pole. Such a distribution of charges can induce a charge in other objects within the plasma chamber such as the wafer W (FIG. 1) or the clamping ring. Furthermore, it is known that negative charge tends to concentrate at low volume, small surface area portions of objects, such as the sharp "pointed" edges of the tips 171 and 173. This high concentration of negative charge increases the rate at which the plasma attacks, i.e., erodes, the tips. Furthermore, the high concentration of negative charge changes the flow of the plasma P, which itself is a collection of charged ions, in the vicinity of the tips. In an effort to obtain some minimum useful life from the rings 160, the tips 171, 173 are made longer, i.e., so that they protrude 13 or 13'≈3 mm. This means that the tips 171 and 173 contact a larger portion of the wafer W thereby reducing the amount of useful surface area of the wafer W.

Figure 5:
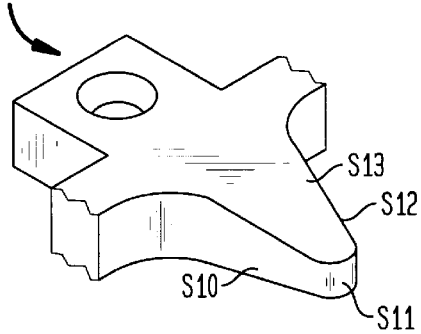
FIG. 5 shows a clamping ring tip according to an embodiment of the present invention.
Figure 6:
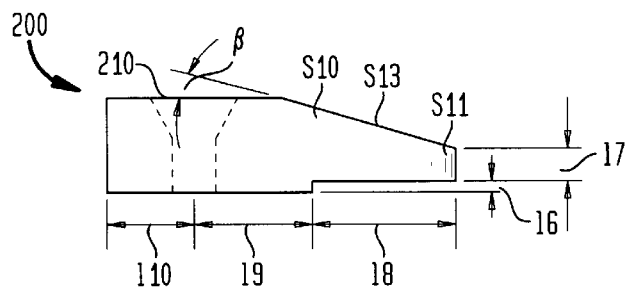
FIG. 6 shows a side view of the clamping ring tip of FIG. 5.
Figure 7:
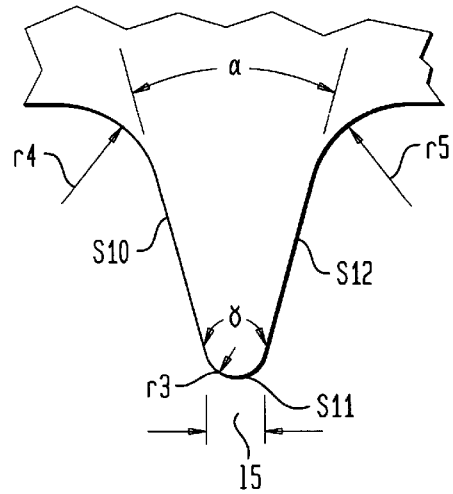
FIG. 7 shows a cross-sectional view of the clamping ring tip of FIG. 5 taken in the plane of the ring.
Figure 2:
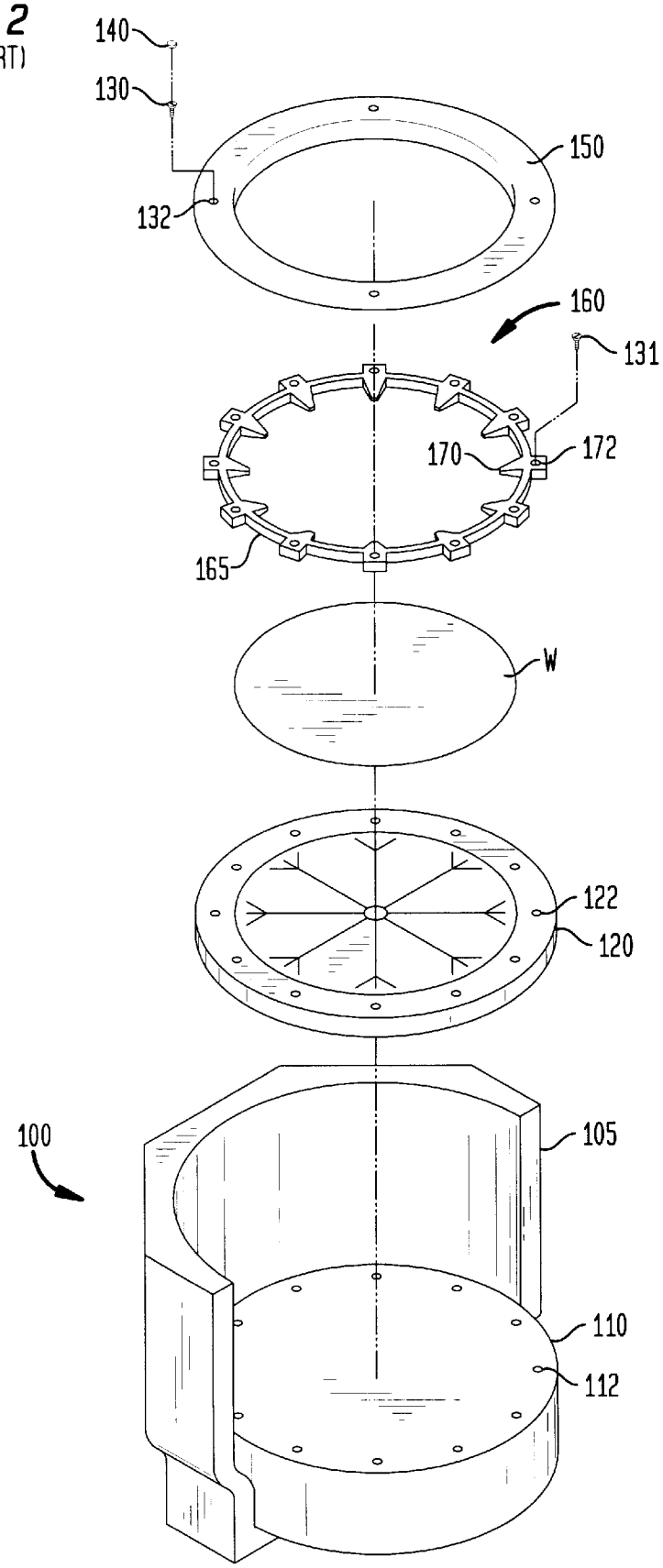
FIG. 2 shows an exploded view of a conventional plasma chamber.

FIGS. 5–7 show a tip 200 according to the present invention in perspective, side and cross-sectional view, respectively. The cross-section view of FIG. 7 is taken in the plane of the ring (not shown) of the clamping ring (e.g., similar to ring 165 of clamping ring 160 of FIG. 2) or some plane parallel thereto. Such a tip 200 may be one of plural, e.g., 12, tips 200 that are mutually evenly spaced about the circumference of a ring (such as the ring 1 65) of a clamping ring. The tip 200 has two sides s10 and s12 which are at least partially planar. These sides s10 and s12 taper at an acute angle α of about 30°, although a can take on other any acute angle value. As shown in FIG. 7, the planar portions of surfaces s10 and s12 lie on line segments of lines that form an angle α. The sides s10 and s12 meet at a surface s11 which is a portion of a convex surface of rotation, e.g., a cylinder, sphere, cone, ellipsoid, etc. In FIG 5, the surface s11 is shown as being about γ=π radians of a surface of a cylinder. Preferably, the surface s11 is more than π/2 radians of a surface of rotation. As shown in FIG. 7, the cross-section of the surface s11 is a single continuous arc of a convex ellipse (in this case, a circle). The surface s11 illustratively has a uniform radius of about r3=1.0 mm. The surfaces s10 and s 12 meet opposite ends of the surface s11, which ends are separated by a distance of about 15=2.0 mm. The surfaces, s10 and s12 meet the inner circumference of the ring at curves having a radius of r4 or r5, respectively, where r4=r5≈2.0 mm.

The tip 200 has a top surface s13 that meets the surfaces, s10, s11 and s12. The top surface s13 is also tapered at angle β of about 16°. The height of the surface s11 is about 17=2.1 mm. A recess 205 of about 16=0.5 mm high is furthermore formed on the underside of the portion of the tip 200 that projects into the interior of the ring so as to provide space for the wafer on which the tip 200 lies. The recess 205 is about 18=4 mm long in the radial direction. This recess 205 is furthermore about 19=22 mm from the center of the tapped hole 210 for receiving the screw. The center of the tapped hole 210 is about 110=37 mm from the edge of the tip 200 most distant from the surface s11. The tips 200 and ring on which they are located, are preferably a single integral assembly made of a plasma erosion resistive material, such as a polyimide.

The clamping ring with tips 200 is used in a similar fashion as described above. That is, a wafer with one or more semiconductor integrated circuits is placed on a pedestal (such as the pedestal 120 of FIG. 2) and clamped to the pedestal 120 by the clamping ring with tips 200. The wafer fits in the recesses 205 of the tips 200. The clamping ring is secured to the pedestal with screws. The quartz cover is secured to the chamber. The wafer is then treated with the plasma. Additional processing steps may be performed in the fabrication of the semiconductor integrated circuits such as photo resist exposure, implantation, diffusion of impurities, chemical mechanical polishing, heating, deposition of layers, etc.

The tips 200 according to the invention have increased surface area "edges". Specifically, sharp or low-surface area edges near the portion of the tip (which is one of the lowest volume portions of the whole clamping ring, and thus most susceptible to accumulation of negative charges) have been replaced by a single, continuous surface of rotation s13 with a surface area of $\gamma \cdot 17$ (which in this case is about $\pi \cdot 2.1 \approx 6.6$ mm$^2$). The result is a dramatic increase of clamping ring lifetime to about 1,000 hours. Furthermore, particulate contamination is reduced and plasma flow uniformity is improved in the vicinity of the tips. Because of the dramatic increase in clamping ring lifetime, the contact length 18 of the tip can be reduced to about 1 mm which reduces the contact area of the wafer to about 2 mm$^2$ per tip. As such, more wafer surface area can be used for integrated circuits.

The above discussion is merely illustrative of the invention. Those skilled in the art may devise numerous alternative embodiments without departing from the spirit and scope of the following claims.

The claimed invention is:

1. A plasma erosion resistive clamping ring for clamping a wafer in a plasma treatment chamber comprising:
   a ring, and
   one or more tips secured to a circumference of the ring, each of the tips projecting in a radial direction towards an interior of the ring, each tip having plural side surfaces that taper to, and meet, a single, continuous convex surface of rotation which is located in the interior of the ring at a location of the tip which is radially most distant from the ring, such that a cross-section of the plural side surfaces and single continuous surface of rotation, taken in a plane of the ring, and including the whole circumference of the ring and all of said tips, comprises first and second line segments, on lines that intersect at an acute angle, and an arc of a convex ellipse that begins at an end of the first line segment most distant from the ring, ends at an end of the second line segment most distant from the ring and is oriented so that each point on the arc between said ends of said first and second line segments protrudes in an inward radial direction of said ring further than said ends of said first and second line segments.

2. The plasma erosion resistive clamping ring of claim 1 further comprising:
   a hole formed through a portion of at least one tip, at a location of the at least one tip other than at the portion of the at least one tip in the interior of the ring most distant from the ring, for securing the clamping ring.

3. The plasma erosion resistive clamping ring of claim 1 wherein the plurality of side surfaces of at least one tip comprises first and second at least partially planar surfaces meeting the surface of rotation, and wherein the surface of rotation is a portion of an outer surface of a cylinder.

4. The plasma erosion resistive clamping ring of claim 3 wherein a distance separating the line segments is more than 1 mm and the arc is an arc of a circle having a radius of at least 1 mm.

5. The plasma erosion resistive clamping ring of claim 4 wherein the acute angle is no more than 30°.

6. The plasma erosion resistive clamping ring of claim 1 wherein the ring and tips are integral and are formed from a plasma erosion resistive material.

7. The plasma erosion resistive clamping ring of claim 1 wherein each tip has a surface of rotation of $\pi/2$ or more radians.

8. The plasma erosion resistive clamping ring of claim 1 further comprising:
   a plurality of said tips which are mutually spaced apart about said circumference of said ring.

9. The plasma erosion resistive clamping ring of claim 1 wherein an axis of rotation of said arc is located in said cross-section plane further from a center of said ring than each point of said arc.

10. The plasma erosion resistive clamping ring of claim 9 wherein said axis of rotation is located within said tip.

11. A plasma treatment apparatus comprising:
    a plasma chamber,
    first and second electrodes located at first and second opposite ends of the plasma chamber for generating an electric field in a first direction between the first and second electrodes,
    a magnet having north and south poles located at third and fourth opposite ends of the plasma chamber, the third and fourth ends being orthogonal to the first and second ends, for generating a magnetic field in a second direction between the north and south poles, the second direction being orthogonal to the first direction,
    a pedestal located within the chamber between the first and second electrodes and the north and south poles,
    a gas inlet for introducing a low pressure gas into the plasma chamber, and
    a clamping ring for clamping a wafer to the pedestal, the clamping ring comprising:
      a ring, and
      one or more tips secured to a circumference of the ring, each of the tips projecting in a radial direction towards an interior of the ring, each tip having plural side surfaces that taper to, and meet, a single, continuous convex surface of rotation which is located in the interior of the ring at a location of the tip which is radially most distant from the ring, such that a cross-section of the plural side surfaces and single continuous surface of rotation, taken in a plane of the ring, and including the whole circumference of the ring and all of said tips, comprises first and second line segments, on lines that intersect at an acute angle, and an arc of a convex ellipse that begins at an end of the first line segment most distant from the ring, ends at an end of the second line segment most distant from the ring and is oriented so that each point on the arc between said ends of said first and second line segments protrudes in an inward radial direction of said ring further than said ends of said first and second line segments.

12. The plasma treatment apparatus of claim 11 further comprising:

a plurality of said tips which are mutually spaced apart about said circumference of said ring.

13. The plasma treatment apparatus of claim 11 wherein an axis of rotation of said arc is located in said cross-section plane further from a center of said ring than each point on said arc.

14. The plasma treatment apparatus of claim 13 wherein said axis of rotation is located within said tip.

15. A semiconductor integrated circuit formed by the steps of:

clamping a wafer containing the semiconductor integrated circuit within a plasma chamber using a clamp comprising a ring, and one or more tips secured to a circumference of the ring, each of the tips projecting in a radial direction towards an interior of the ring, each tip having plural side surfaces that taper to, and meet, a single, continuous convex surface of rotation which is located in the interior of the ring at a location of the tip which is radially most distant from the ring, such that a cross-section of the plural side surfaces and single continuous surface of rotation, taken in a plane of the ring, and including the whole circumference of the ring and all of said tips, comprises first and second line segments, on lines that intersect at an acute angle, and an arc of a convex ellipse that begins at an end of the first line segment most distant from the ring, ends at an end of the second line segment most distant from the ring and is oriented so that each point on the arc between said ends of said first and second line segments protrudes in an inward radial direction of said ring further than said ends of said first and second line segments, wherein only the tips of the clamp contact the wafer while clamped, and treating the wafer with a plasma while clamped.

16. The semiconductor integrated circuit of claim 15 wherein said clamp comprises a plurality of said tips which are mutually spaced apart about said circumference of said ring.

17. The semiconductor integrated circuit of claim 15 wherein an axis of rotation of said arc is located in said cross-section plane further from a center of said ring than each point on said arc.

18. The semiconductor integrated circuit of claim 17 wherein said axis of rotation is located within said tip.

* * * * *